(12) United States Patent
Stegamat et al.

(10) Patent No.: US 6,946,319 B2
(45) Date of Patent: Sep. 20, 2005

(54) ELECTRODE FOR AN ELECTRONIC DEVICE

(75) Inventors: Reza Stegamat, Milpitas, CA (US); Pierre-Marc Allemand, San Jose, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/447,988

(22) Filed: May 29, 2003

(65) Prior Publication Data

US 2004/0241972 A1 Dec. 2, 2004

(51) Int. Cl.$^7$ .......................... H01L 21/00; H01L 21/16
(52) U.S. Cl. .......................... 438/104; 438/99
(58) Field of Search .......................... 438/99, 22, 82, 438/100, 101, 102, 103, 104

(56) References Cited

U.S. PATENT DOCUMENTS

| | | | |
|---|---|---|---|
| 5,677,572 A | 10/1997 | Hung et al. | 257/750 |
| 5,703,436 A | 12/1997 | Forrest et al. | 313/506 |
| 5,776,623 A * | 7/1998 | Hung et al. | 428/690 |
| 6,404,126 B1 | 6/2002 | Arai et al. | 313/503 |
| 6,430,810 B1 * | 8/2002 | Bailey | 29/846 |
| 6,432,741 B1 | 8/2002 | Mueller et al. | 438/99 |
| 6,563,262 B1 * | 5/2003 | Cao | 313/506 |

* cited by examiner

*Primary Examiner*—David Nhu
(74) *Attorney, Agent, or Firm*—Thomas George

(57) ABSTRACT

An embodiment of the present invention pertains to an electrode that includes a metal oxide layer, and a conductive layer on that metal oxide layer. The metal oxide layer is an alkali metal oxide or an alkaline earth metal oxide that is formed by: (1) decomposing a compound that includes (a) oxygen and (b) an alkali metal or an alkaline earth metal, or (2) thermally reacting at least two compounds where one of the at least two compounds includes the alkali metal or the alkaline earth metal, and another one of the at least two compounds includes oxygen. The metal oxide layer can also be formed by thermally reacting at least two compounds where one of those compounds includes (a) oxygen and (b) an alkali metal or an alkaline earth metal.

21 Claims, 8 Drawing Sheets

FIG. 6

| Electron Injection Layer | Max Efficiency (Cd/A) | Luminance @ 5.8V (cd/m2) |
|---|---|---|
| Barium | 8.1 | 3500 |
| Cesium Oxide | 9.2 | 7700 |

FIG. 8

| Thickness | Luminance at 5 Volts | Half-Life at 80C and 250 cd/m2 |
|---|---|---|
| (nm) | (cd/m2) | (hours) |
| 0.3 | 9700 | 110 |
| 0.5 | 7300 | 105 |
| 1 | 4950 | 70 |

ELECTRODE FOR AN ELECTRONIC DEVICE

BACKGROUND OF THE INVENTION

Electronic devices need an electrode that provides a low contact resistance with a semiconductive material. Example of electronic devices include organic and inorganic electronic devices. Examples of organic electronic devices include organic light emitting diodes ("OLEDs") (the OLED can be used in, for example, a display or as a light source element of a light source used for general purpose lighting), organic solar cells, organic transistors, organic detectors, and organic lasers. Such devices typically include a pair of electrodes (e.g., an anode and a cathode) with at least one semiconductive layer between the electrodes.

In the particular case of the OLED, the OLED is typically comprised of two or more thin organic layers (e.g., a conducting polymer layer and an emissive polymer layer where the emissive polymer layer emits light) separating its anode and cathode. Under an applied potential, the anode injects holes into the conducting polymer layer, while the cathode injects electrons into the emissive polymer layer. The injected holes and electrons each migrate toward the oppositely charged electrode and produce an electroluminescent emission upon recombination in the emissive polymer layer.

The OLED's cathode is typically a multilayer structure that includes, generally, a thin electron injecting layer that has a low work function, and also a thick conductive layer such as, for example, aluminum, silver, magnesium, gold, copper, or a mixture thereof. The electron injecting layer with the low work function provides an electrically conductive path for current flow as well as a way to efficiently inject electrons into the adjacent emissive polymer layer. One problem with low work function metals is that they readily react with the environment (e.g., oxygen and moisture). For example, a low work function calcium cathode survives only a short time in air due to rapid device degradation caused by atmospheric moisture and oxygen. It would be desirable to have an electron injecting layer that has a low work function and is less likely to react with the environment.

In addition, the electron injecting layer can be difficult to deposit on the semiconductive layer of the electronic device because, for example, some materials have a high melting point. It would be desirable to have an electron injecting layer that can be easily deposited on the semiconductive layer.

In the OLED, typically, different electron injecting materials are used depending on the type of emissive polymer layer on which it is placed (different types of emissive polymer layers are used depending on, for example, the desired color that is to be emitted by the layer). For example, a first electron injecting layer placed on an emissive polymer layer that emits the color blue can provide a lower drive voltage than a second electron injecting layer comprised of a different material. Specifically, in terms of overall performance, barium and calcium are the most common and effective materials for use as the electron injecting layer in OLED devices that emit the color green or yellow. For an OLED that emits the color blue, lithium fluoride is the most common material for use as the electron injecting layer in this type of OLED (the lithium fluoride is typically capped by a calcium layer). When fabricating full color displays, it is desirable to have one electron injecting layer that can be effectively used with emissive polymer layers that emit any of the colors.

For the foregoing reasons, there exists a need for an electron injecting layer that has a low work function, is less likely to react with the environment, can be easily deposited, and in the case of an organic light emitting diode, effectively interfaces with different emissive polymer layers that emit different colors.

SUMMARY

A first embodiment of an electrode is described. This electrode includes a metal oxide layer, and a conductive layer on the metal oxide layer. The metal oxide layer is an alkali metal oxide or an alkaline earth metal oxide that is formed by: (1) decomposing a compound that includes (a) oxygen and (b) an alkali metal or an alkaline earth metal, or (2) thermally reacting at least two compounds where one of the at least two compounds includes the alkali metal or the alkaline earth metal, and another one of the at least two compounds includes oxygen.

A second embodiment of an electrode is described. This electrode includes a metal oxide layer, and a conductive layer on the metal oxide layer. The metal oxide layer is an alkali metal oxide or an alkaline earth metal oxide that is formed by thermally reacting at least two compounds where one of the at least two compounds includes (1) oxygen and (2) an alkali metal or an alkaline earth metal.

BRIEF DESCRIPTION OF THE DRAWINGS

FIG. 6 is a table that compares the efficiency and luminance of OLEDs in which the electron injecting layer is barium and cesium oxide.

FIG. 8 is a table that compares the average luminance and the average half-life of three different sets of displays with different cesium oxide layer thicknesses.

DETAILED DESCRIPTION

Figure 1:
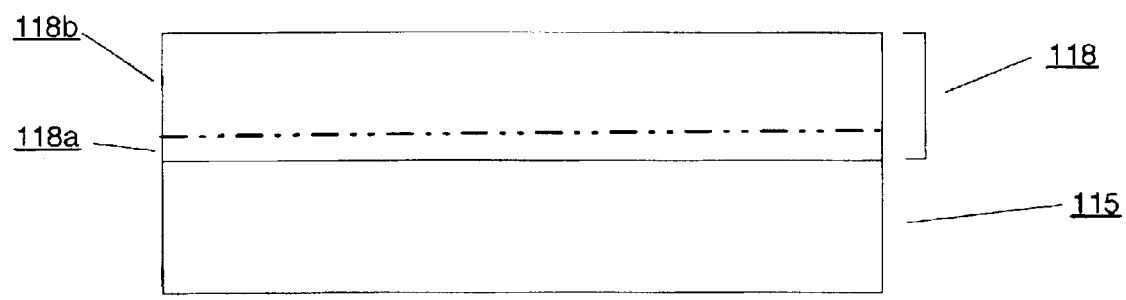
FIG. 1 shows an embodiment of an electrode according to the present invention.

FIG. 1 shows an embodiment of an electrode 118 according to the present invention. In FIG. 1, the electrode 118 is on a semiconductor 115. As used within the specification and the claims, the term "on" includes when layers are in physical contact and when layers are separated by one or more intervening layers. The semiconductor 115 includes inorganic materials such as, for example, cadmium sulfide, gallium sulfide, zinc sulfide, or a compound made of elements from groups III–V of the periodic table. The semiconductor 115 also includes organic materials such as, for example, polyphenylenevinylene ("PPV"), PPV derivatives, polyfluorene ("PF"), PF derivatives, or small molecules such as metal chelate compounds such as, for example, aluminumhydroxyquinolate ("Alq3").

The electrode 118 includes: (1) an electron injecting layer comprised of a metal oxide layer 118a, and (2) a conductive layer 118b. The conductive layer 118b is comprised of a metallic layer such as, for example, silver, aluminum, magnesium, gold, copper, or a mixture thereof. The metal oxide layer 118a is either an alkali metal oxide or an alkaline earth metal oxide and is formed by: (1) decomposing a compound that includes (a) oxygen and (b) an alkali metal or an alkaline earth metal; (2) thermally reacting at least two compounds where one of the compounds includes an alkali metal or an alkaline earth metal, and another one of the compounds includes oxygen; or (3) thermally reacting at least two compounds where one of those compounds includes (a) oxygen and (b) an alkali metal or an alkaline earth metal.

The term "compound", as used herein, includes salts. For example, for (1) in the previous paragraph, the compound that includes (a) oxygen and (b) an alkali metal or an alkaline earth metal can be a salt that includes (a) oxygen and (b) an alkali metal or an alkaline earth metal. The salt can be, for example, formates, acetates, carbonates, bicarbonates, sulphates, nitrates, or oxalates of the an alkali metal or the alkaline earth metal. In addition, for (2) in the previous paragraph, the one of the compounds that includes the alkali metal or the alkaline earth metal can be a salt that includes the alkali metal or the alkaline earth metal. For (3) in the previous paragraph, the particular one of the compounds that includes (a) oxygen and (b) an alkali metal or an alkaline earth metal can be a salt that includes oxygen and an alkali metal or an alkaline earth metal.

In one configuration of this embodiment, the decomposing of the compound occurs by heating it so that the metal oxide (i.e., the alkali metal oxide or the alkaline earth metal oxide) is evaporated onto the semiconductor 115 while residual gasses are removed. Thermally reacting the at least two compounds includes physically mixing the compounds and then heating the mixture so that the metal oxide is evaporated onto the semiconductor 115 while the residual gasses are removed.

The term "alkali metal" is used in the conventional sense to refer to elements of Group IA of the periodic table. Preferred alkali metals include lithium (i.e., Li), sodium (i.e., Na), potassium (i.e., K), rubidium (i.e., Rb), or cesium (i.e., Cs). The term "alkali metal oxide" is used in the conventional sense to refer to compounds of one or more alkali metals and oxygen. For convenience, alkali metal oxides are referred to herein by the chemical formula of the corresponding simple oxide (e.g., $Li_2O$, $Na_2O$, $K_2O$, $R_2O$, or $Cs_2O$); however, this reference to the simple oxide is intended to encompass other oxides, including mixed oxides and non-stoichiometric oxides (e.g., $Li_xO$, $Na_xO$, $K_xO$, $Rb_xO$, or $Cs_xO$, where x is from about 0.1 to about 2).

The term "alkaline earth metal" is used in the conventional sense to refer to elements of Group IIA of the periodic table. Preferred alkaline earth metals include magnesium (i.e., Mg), calcium (i.e., Ca), strontium (i.e., Sr), or barium (i.e., Ba). The term "alkaline earth metal oxide" is used in the conventional sense to refer to compounds of one or more alkaline earth metals and oxygen. For convenience, alkaline earth metal oxides are referred to by the chemical formula of the corresponding simple oxide (e.g., MgO, BaO, CaO, SrO, or BaO); however, this reference to the simple oxide is intended to encompass other oxides, including mixed oxides and non-stoichiometric oxides (e.g., $Mg_xO$, $Ba_xO$, $Ca_xO$, $Sr_xO$, or $Ba_xO$, where x is from about 0.1 to about 1).

The range of thickness of the metal oxide layer 118a is such that the metal oxide layer 118a forms a continuous film but not too thick that the flow of electrons from the conductive layer 118b to the semiconductor 115 is substantially reduced. Specifically, the metal oxide layer 118a is a thin layer and the range of thickness of the metal oxide layer 118a is from about 0.1 nanometers ("nm") to about 20 nm; preferably, is from about 0.1 nm to about 10 nm; and more preferably, is from about 0.3 nm to about 1 nm.

The alkali metal oxide and the alkaline earth metal oxide have a low work function and reduce or eliminate the barrier height for electron injection from the conductive layer 118b to the lowest unoccupied molecular orbital ("LUMO") of the semiconductor 115.

Preferably, the metal oxide layer 118a is a cesium oxide layer that is formed by: (1) decomposing a compound that includes (a) the oxygen and (b) the cesium; (2) thermally reacting at least two compounds where one of the compounds includes the cesium, and another one of the compounds includes the oxygen; or (3) thermally reacting at least two compounds where one of those compounds includes (a) the oxygen and (b) the cesium. For (1), the compound that includes (a) the oxygen and (b) the cesium can be a cesium salt such as, for example, a cesium carbonate, a cesium bicarbonate, a cesium acetate, a cesium oxalate, or a cesium formate.

More preferably, the metal oxide layer 118a is a cesium oxide layer that is formed by: (1) decomposing cesium carbonate; or (2) thermally reacting cesium sulfate and barium oxide. For (1), the cesium carbonate is decomposed by applying heat to the cesium carbonate as shown in the following reaction:

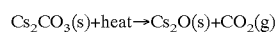

$Cs_2CO_3(s)+heat \rightarrow Cs_2O(s)+CO_2(g)$

In one configuration of this embodiment, the heating of the cesium carbonate (which is in a solid state) occurs in a vacuum chamber, and after sufficient heat is applied, the resulting cesium oxide (which is in a solid state) is evaporated onto the semiconductor 115 while the resulting carbon dioxide (which is in a gaseous state) is removed from the vacuum chamber.

For (2), the cesium sulfate (which is in a solid state) and the barium oxide (which is in a solid state) are physically mixed and this mixture is heated as shown in the following reaction:

$Cs_2SO_4(s)+BaO(s)+heat \rightarrow Cs_2O(s)+BaSO_4(g)$

In one configuration of this embodiment, the heating of the mixture occurs in a vacuum chamber and after sufficient heat is applied, the resulting cesium oxide (which is in a solid state) is evaporated onto the semiconductor 115 while the resulting barium sulfate (which is in a gaseous state) is removed from the vacuum chamber.

The cesium oxide layer can be any one of the following: CsO, $Cs_2O$, or $CsO_2$. The range of thickness of the cesium oxide layer (e.g., the metal oxide layer 118a) is such that the cesium oxide layer forms a continuous film but not too thick that the flow of electrons from the conductive layer 118b to the semiconductor 115 is substantially reduced. Specifically, the range of thickness of the cesium oxide layer is from about 0.1 nm to about 10 nm; preferably, is from about 0.3 nm to about 1 nm; more preferably, from about 0.3 nm to about 0.5 nm; and most preferably, about 0.3 nm.

The cesium oxide layer has a low work function of, for example, 0.7 eV thus reducing or eliminating the barrier height for electron injection from the conductive layer 118b to the lowest unoccupied molecular orbital ("LUMO") of the semiconductor 115. Metal oxides are also more stable than metals in their pure form. For example, cesium oxide is more stable in air than, for example, cesium, barium, or calcium metals. A thin layer of cesium is hard and only slightly hydroscopic when exposed to air. Typically, alkali metals and alkali earth metals almost instantaneously react with air to form oxides or hydroxides. The cesium oxide layer is less likely to react with the environment than other electron injecting materials such as barium or calcium since cesium oxide is already the oxidation product resulting from the oxidation of metallic cesium by oxygen.

Figure 2:
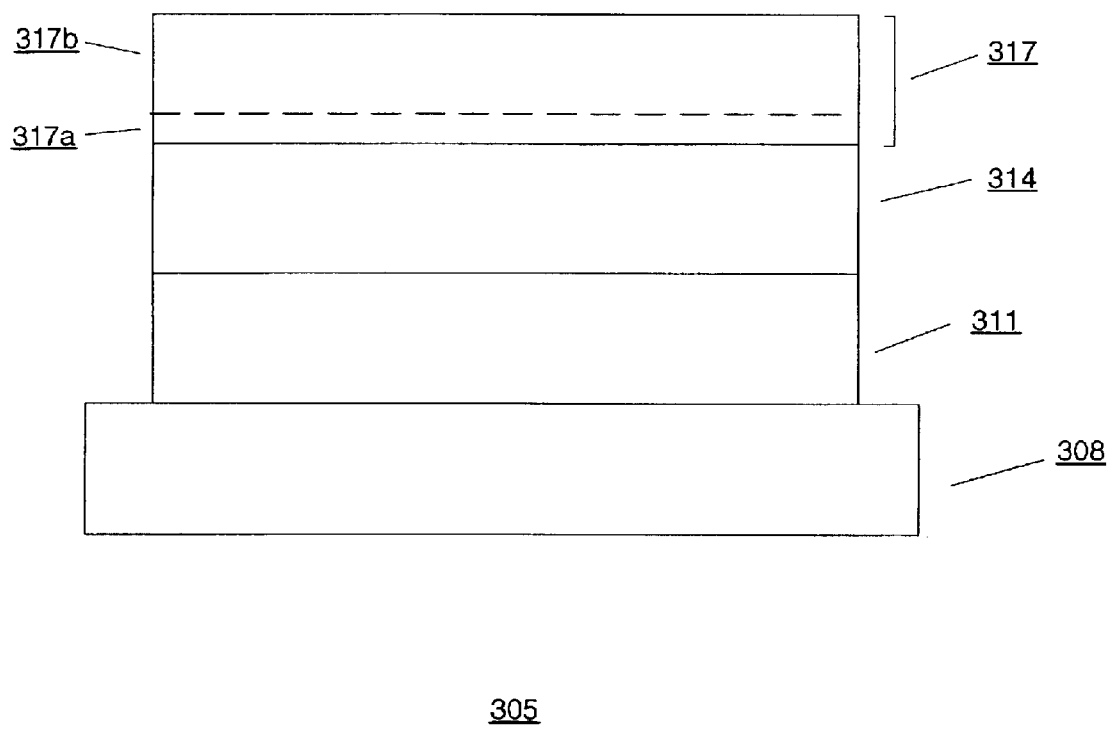
FIG. 2 shows an embodiment of an electronic device according to the present invention.

FIG. 2 shows an embodiment of an electronic device 305 according to the present invention. The electronic device 305 includes a substrate 308 and a first electrode 311 on the substrate 308. The first electrode 311 may be patterned for pixilated applications or unpatterned for backlight applications. If the electronic device 305 is a transistor, then the first electrode may be, for example, the source and drain contacts of that transistor. The electronic device 305 also includes one or more semiconductor layers 314 on the first electrode 311. The semiconductor layers 314 can be comprised of organic or inorganic materials. The electronic device 305 includes a second electrode 317 on the one or more semiconductor layers 314. If the electronic device 305 is a transistor, then the second electrode may be, for example, the gate contact of that transistor. The second electrode 317 includes: (1) an electron injecting layer comprised of a metal oxide layer 317a, and (2) a conductive layer 317b. The conductive layer 317b is comprised of a metallic layer such as, for example, silver, aluminum, magnesium, gold, copper, or a mixture thereof.

The metal oxide layer 317a is either an alkali metal oxide or an alkaline earth metal oxide and is formed by: (1) decomposing a compound that includes (a) oxygen and (b) an alkali metal or an alkaline earth metal; (2) thermally reacting at least two compounds where one of the compounds includes an alkali metal or an alkaline earth metal, and another one of the compounds includes oxygen; or (3) thermally reacting at least two compounds where one of those compounds includes (a) oxygen and (b) an alkali metal or an alkaline earth metal.

Preferably, the metal oxide layer 317a is a cesium oxide layer that is formed by: (1) decomposing a compound that includes (a) the oxygen and (b) the cesium; (2) thermally reacting at least two compounds where one of the compounds includes the cesium, and another one of the compounds includes the oxygen; or (3) thermally reacting at least two compounds where one of those compounds includes (a) the oxygen and (b) the cesium. More preferably, the metal oxide layer 317a is a cesium oxide layer that is formed by: (1) decomposing cesium carbonate; or (2) thermally reacting cesium sulfate and barium oxide.

Other layers than that shown in FIG. 2 may be added including insulating layers between the first electrode 311 and the one or more semiconductor layers 314, and/or between the one or more semiconductor layers 314 and the second electrode 317.

Figure 3:
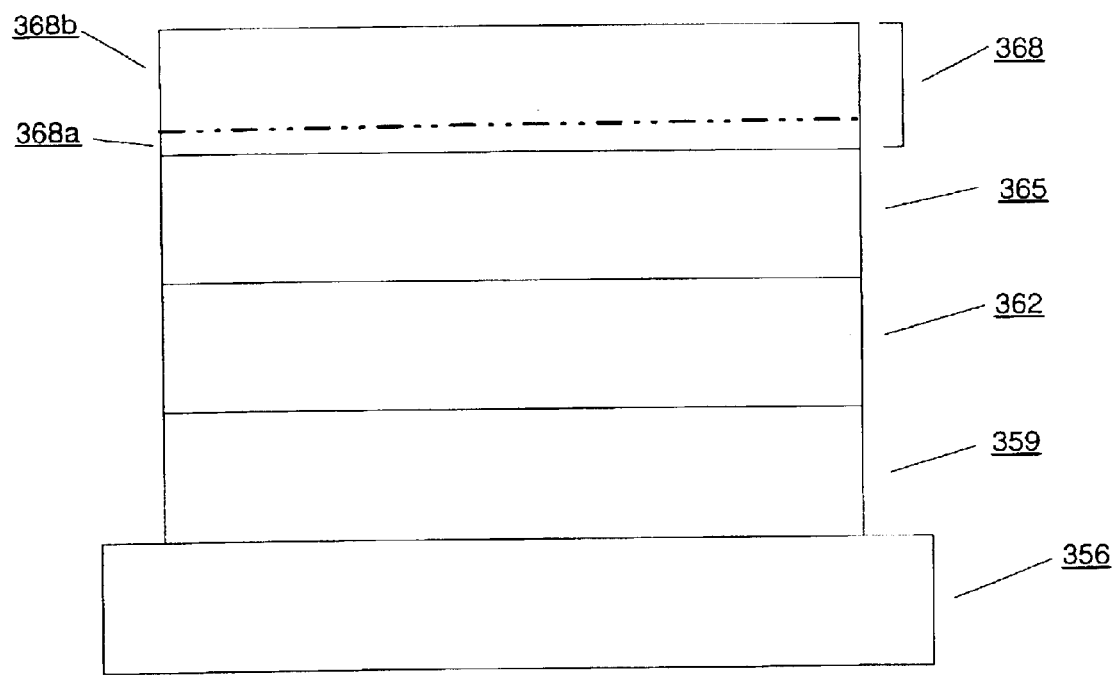
FIG. 3 shows an embodiment of an OLED according to the present invention.

A specific example of an electronic device is an OLED. FIG. 3 shows an embodiment of an OLED 353 according to the present invention. The OLED 353 includes a flexible or rigid substrate 356 that may be comprised of, for example, glass or plastic. The OLED 353 also includes a first electrode such as an anode layer 359 that is deposited on the substrate 356. The anode layer 359 may be, for example, indium tin oxide ("ITO"). The OLED 353 also includes at least one semiconductor layer, preferably, two organic layers: a conducting polymer layer 362 that is deposited on the anode layer 359, and an emissive polymer layer 365 that is deposited on the conducting polymer layer 362. The conducting polymer layer 362 assists in injecting and transporting holes. The emissive polymer layer 365 assists in injecting and transporting electrons. In one configuration of this embodiment, the emissive polymer layer 365 emits light. In another configuration, another separate layer is deposited that emits light. The OLED 353 includes a second electrode that is a cathode layer 368 that is deposited on the emissive polymer layer 365. The cathode layer 368 includes: (1) an electron injecting layer comprised of a metal oxide layer 368a, and (2) a conductive layer 368b. The conductive layer 368b is comprised of a metallic layer such as, for example, silver, aluminum, magnesium, copper, gold, or a mixture thereof. The metal oxide layer 118a is a thin layer comprised of either an alkali metal oxide or an alkaline earth metal oxide.

Alternatively, in another embodiment of the OLED, the cathode layer, rather than the anode layer, is deposited on the substrate. The emissive polymer layer is deposited on the cathode layer and the conducting polymer layer is deposited on the emissive polymer layer. The anode layer is deposited on the conducting polymer layer.

The OLED layers mentioned earlier are discussed in greater detail below:

Substrate 356:

The substrate 356 can be any material, which can support the layers, and is transparent or semi-transparent to the wavelength of light generated in the device. By modifying or filtering the wavelength of light which can pass through the substrate, the color of light emitted by the device can be changed. Preferable substrate materials include glass, quartz, silicon, and plastic, preferably, thin, flexible glass. The preferred thickness of the substrate 356 depends on the material used and on the application of the device. The substrate 356 can be in the form of a sheet or continuous film, such as preferably used for roll-to-roll manufacturing processes, which are particularly suited for plastic, metal, and metallized plastic foils.

Anode Layer 359:

The anode layer 359 is a conductive layer which serves as a hole-injecting layer and which comprises a material with work function greater than about 4.5 eV. Typical anode materials include metals (such as aluminum, silver, platinum, gold, palladium, tungsten, indium, copper, iron, nickel, zinc, lead, and the like); metal oxides (such as lead oxide, tin oxide, ITO, and the like); graphite; doped inorganic semiconductors (such as silicon, germanium, gallium arsenide, and the like); and doped conducting polymers (such as polyaniline, polypyrrole, polythiophene, and the like). When metals such as those listed above are used, the anode layer 359 is typically sufficiently thin so as to be semi-transparent to the light emitted from the emissive layer. Metal oxides such as ITO and conducting polymers such as polyaniline and polypyrrole are typically semi-transparent in the visible portion of the spectrum.

The anode layer 359 can typically be fabricated using any of the techniques known in the art for deposition of thin films, including, for example, vacuum evaporation, sputtering, electron beam deposition, or chemical vapor deposition, using for example, pure metals or alloys, or other film precursors. Typically, the anode layer 359 has a thickness of about 30 nm to about 300 nm.

Conducting Polymer Layer 362:

The conducting polymer layer 362 is used to enhance the hole yield of the OLED in relation to the electric potential applied. Preferred conductive polymers include, but are not limited to polyethylenedioxythiophene-polystyrenesulfonic acid ("PEDOT:PSS") and polyaniline ("PANI").

Preferably, the thickness of the conducting polymer layer 362 is from about 5 to about 1000 nm, more preferably from about 20 to about 500 nm, and most preferably from about 50 to about 250 nm.

The conducting polymer layer 362 is usually applied in the form of a solution. Many application methods are known to those of ordinary skill in the art. Examples include, but are not limited to, spin coating, dip coating, roll coating, spray-coating, blade coating, or thermal evaporation onto the anode layer 359. Printing techniques including, but not limited to, screen-printing, flexographic printing, and ink-jet printing (drop-on-demand, continuous, or semi-continuous) may also be used to apply the conducting polymer layer 362.

Emissive Polymer Layer 365:

For OLEDs, the emissive polymer layer 365 comprises an electroluminescent, semiconductor, organic material. Examples of the emissive polymer layer 365 include:

(i) poly(p-phenylene vinylene) and its derivatives substituted at various positions on the phenylene moiety;
(ii) poly(p-phenylene vinylene) and its derivatives substituted at various positions on the vinylene moiety;
(iii) poly(p-phenylene vinylene) and its derivatives substituted at various positions on the phenylene moiety and also substituted at various positions on the vinylene moiety;
(iv) poly(arylene vinylene), where the arylene may be such moieties as naphthalene, anthracene, furylene, thienylene, oxadiazole, and the like;
(v) derivatives of poly(arylene vinylene), where the arylene may be as in (iv) above, and additionally have substituents at various positions on the arylene;
(vi) derivatives of poly(arylene vinylene), where the arylene may be as in (iv) above, and additionally have substituents at various positions on the vinylene;
(vii) derivatives of poly(arylene vinylene), where the arylene may be as in (iv) above, and additionally have substituents at various positions on the arylene and substituents at various positions on the vinylene;
(viii) co-polymers of arylene vinylene oligomers, such as those in (iv), (v), (vi), and
(vii) with non-conjugated oligomers; and
(ix) polyp-phenylene and its derivatives substituted at various positions on the phenylene moiety, including ladder polymer derivatives such as poly(9,9-dialkyl fluorene) and the like;
(x) poly(arylenes) where the arylene may be such moieties as naphthalene, anthracene, furylene, thienylene, oxadiazole, and the like; and their derivatives substituted at various positions on the arylene moiety;
(xi) co-polymers of oligoarylenes such as those in (x) with non-conjugated oligomers;
(xii) polyquinoline and its derivatives;
(xiii) co-polymers of polyquinoline with p-phenylene substituted on the phenylene with, for example, alkyl or alkoxy groups to provide solubility; and
(xiv) rigid rod polymers such as poly(p-phenylene-2,6-benzobisthiazole), poly(p-pheylene-2,6-benzobisoxazole), polyp-phenylene-2,6-benzimidazole), and their derivatives.

A preferred polymeric emitting material that emits yellow-light and includes polyphenelenevinylene derivatives is available from Covion Organic Semiconductors GmbH, Industrial park Hoechst, Frankfurt, Germany. Another especially preferred polymeric emitting material that emits green-light and includes fluorene-copolymers is available as LUMATION polymers from Dow Chemical, Midland, Mich.

Alternatively, rather than polymers, small organic molecules that emit by fluorescence or by phosphorescence can serve as the emissive layer. Examples of small-molecule organic emitting materials include: (i) tris(8-hydroxyquinolinato) aluminum (Alq); (ii) 1,3-bis(N,N-dimethylaminophenyl)-1,3,4-oxidazole (OXD-8); (iii)-oxo-bis(2-methyl-8-quinolinato)aluminum; (iv) bis(2-methyl-8-hydroxyquinolinato) aluminum; (v) bis (hydroxybenzoquinolinato) beryllium (BeQ.sub.2); (vi) bis (diphenylvinyl)biphenylene (DPVBI); and (vii) arylamine-substituted distyrylarylene (DSA amine).

Such polymeric and small-molecule materials are well known in the art and are described in, for example, U.S. Pat. No. 5,047,687 issued to VanSlyke, and Bredas, J.-L., Silbey, R., eds., Conjugated Polymers, Kluwer Academic Press, Dordrecht (1991).

Metal Oxide Layer 368a:

The metal oxide layer 368a is either an alkali metal oxide or an alkaline earth metal oxide and is formed by: (1) decomposing a compound that includes (a) oxygen and (b) an alkali metal or an alkaline earth metal; (2) thermally reacting at least two compounds where one of the compounds includes an alkali metal or an alkaline earth metal, and another one of the compounds includes oxygen; or (3) thermally reacting at least two compounds where one of those compounds includes (a) oxygen and (b) an alkali metal or an alkaline earth metal.

Preferably, the metal oxide layer 368a is a cesium oxide layer that is formed by: (1) decomposing a compound that includes (a) the oxygen and (b) the cesium; (2) thermally reacting at least two compounds where one of the compounds includes the cesium, and another one of the compounds includes the oxygen; or (3) thermally reacting at least two compounds where one of those compounds includes (a) the oxygen and (b) the cesium.

More preferably, the metal oxide layer 368a is a cesium oxide layer that is formed by: (1) decomposing cesium carbonate; or (2) thermally reacting cesium sulfate and barium oxide. The range of thickness of the cesium oxide layer is such that the cesium oxide layer forms a continuous film but not too thick that the flow of electrons from the conductive layer 368b to the emissive polymer layer 365 is substantially reduced. Specifically, the range of thickness of the cesium oxide layer is from about 0.1 nm to about 20 nm; preferably, is from about 0.3 nm to about 1 nm; more preferably, from about 0.3 nm to about 0.5 nm; and most preferably, about 0.3 nm.

The cesium oxide layer reduces the barrier to electron injection from the conductive layer 368b to the semiconductive organic emissive polymer layer 365. The work function of the cesium oxide layer 368a is closer to the LUMO level of the emissive polymer layer 365 than the work function of the conductive layer 368b. By bringing the work function closer to the LUMO level of the emissive polymer layer 365, the barrier to electron injection is reduced or eliminated thus increasing the efficiency of the OLED 353. The conductive layer 368b provides the electrons to the cesium oxide layer that are injected to the emissive polymer layer 365.

Due, in part, to its low work function, the cesium oxide layer can be efficiently used with various emissive polymer layers with different LUMO levels. For example, the cesium oxide layer can be the electron injecting layer in a common cathode that is used with different emissive polymer layers that emit, e.g., any of the following colors: red, green, blue, or white.

Conductive Layer 368b:

The conductive layer 368b is comprised of a metallic layer such as, for example, aluminum, silver, gold, magnesium, copper, or a mixture thereof, or alloys thereof. The thickness of the conductive layer 368b is from about 10 nm to about 1000 nm, more preferably from about 50 nm to about 500 nm, and most preferably from about 100 nm to about 300 nm. While many methods are known to those of ordinary skill in the art by which the conductive layer can be deposited, vacuum deposition methods are preferred.

EXAMPLES

The following examples are presented for a further understanding of the invention and should not be construed as limiting the scope of the appended claims or their equivalents.

Example 1
(OLED with a Prior Art Electron Injection Layer):

An OLED was fabricated in the following manner:
(1) for the conducting polymer layer, a 70 nm layer of a hole conducting polymer polyethylenedioxythiophene-polystyrenesulfonic acid ("PEDOT:PSS") was deposited on an anode layer comprised of about 120 nm of indium tin oxide ("ITO"). This conducting polymer is commercially available from H. C. Starck, located in Goslar, Germany
(2) for the emissive polymer layer, a 70 nm layer of a substituted polyparaphenylenevinylene was deposited on the 70 nm layer of the conducting polymer layer. The emissive polymer layer is known by its commercial name "Super Yellow" and is commercially available from Covion Organic Semiconductors.
(3) for the electron injecting layer, a barium layer was deposited on the emissive layer by resistive-heating in a vacuum evaporator such that the barium layer was evaporated and deposited onto the emissive layer. The thickness of the barium layer is 3.0 nm.

Figure 4:
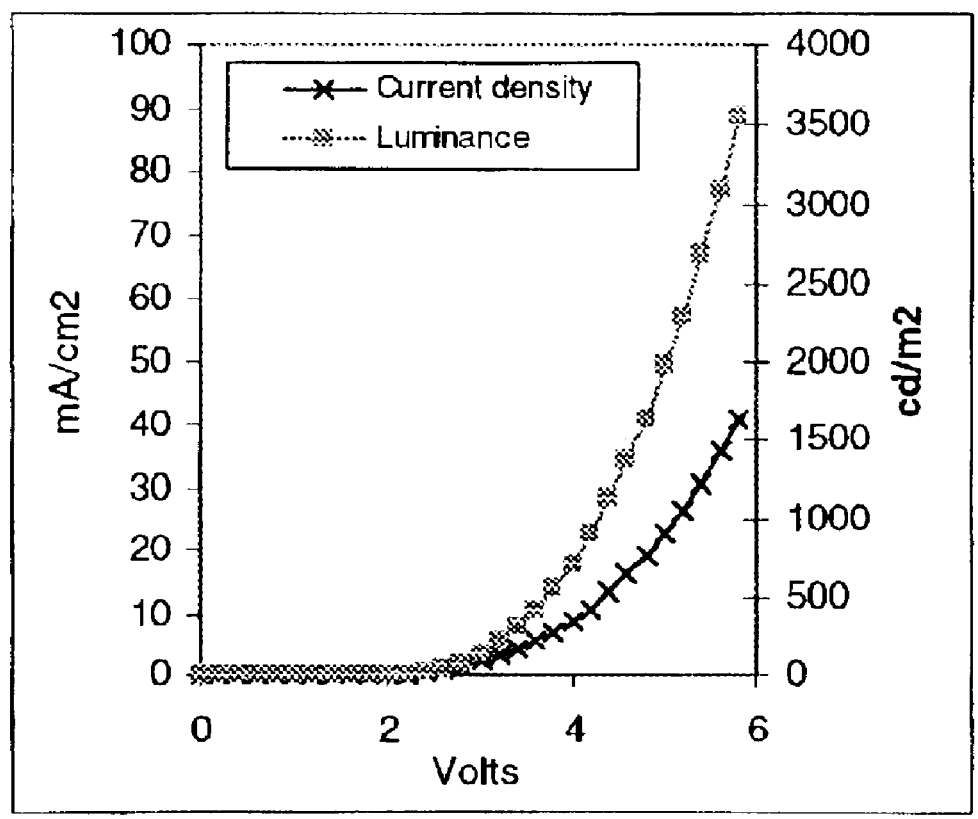
FIG. 4 shows the current density versus voltage curve, and the luminance versus voltage curve for an OLED with barium as the electron injecting layer.

FIG. 4 shows the current density versus voltage curve, and the luminance versus voltage curve for the OLED fabricated as described earlier with barium as the electron injecting layer.

Example 2

An OLED was fabricated in the following manner:
(1) for the conducting polymer layer, a 70 nm layer of a hole conducting polymer PEDOT:PSS was deposited on an anode layer comprised of about 120 nm of ITO.
(2) for the emissive polymer layer, a 70 nm layer of Super Yellow was deposited on the 70 nm layer of PEDOT:PSS.
(3) for the electron injecting layer, a cesium oxide layer was deposited on the Super Yellow layer. The thickness of the cesium oxide layer is 0.2 nm. The cesium oxide layer was formed by the resistive heating of the cesium carbonate, $Cs_2CO_3$, in a vacuum evaporator resulting in a thermal decomposition of the cesium carbonate. The thermal decomposition of the cesium carbonate produced two compounds: the cesium oxide and the carbon dioxide. The produced cesium oxide was deposited on the emissive layer and the carbon dioxide was removed by the vacuum. The cesium carbonate is commercially available from Aldrich Chemical Company located in Milwaukee, Wis.
(4) for the conductive cathode layer, a 250 nm layer of aluminum was deposited on the cesium oxide layer.

Figure 5:
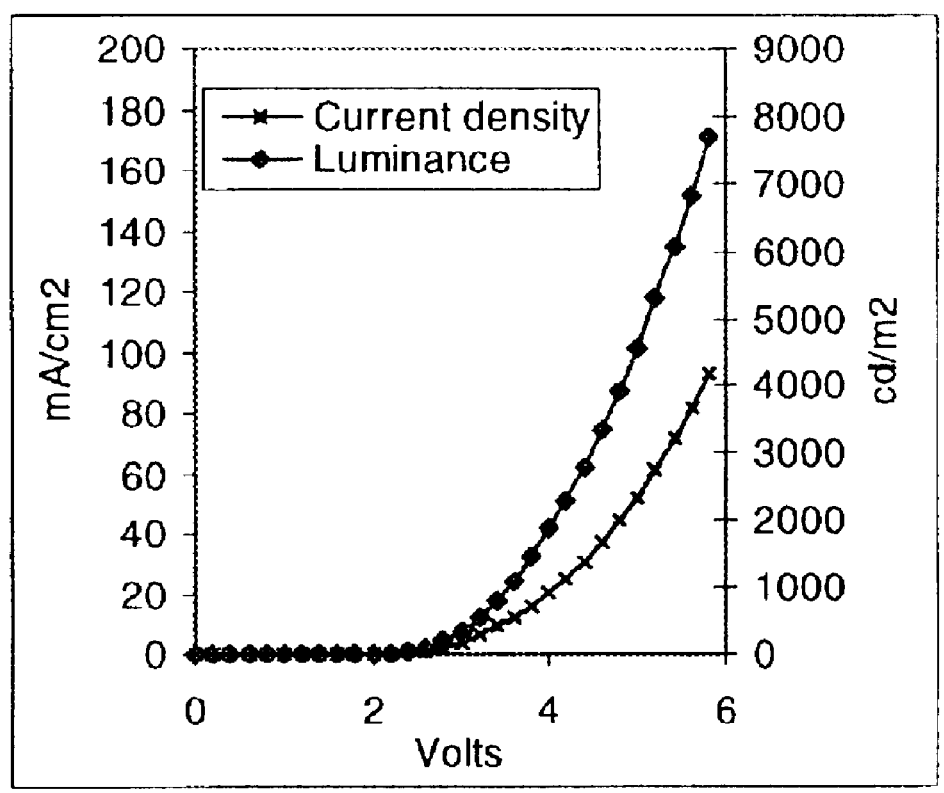
FIG. 5 shows the current density versus voltage curve, and the luminance versus voltage curve for an OLED with cesium oxide as the electron injecting layer.

FIG. 5 shows the current density versus voltage curve, and the luminance versus voltage curve for the OLED fabricated as described earlier with cesium oxide as the electron injecting layer.

FIG. 6 is a table that compares the efficiency and luminance of OLEDs fabricated as described earlier in which the electron injecting layer is barium and cesium oxide.

As FIGS. 4, 5, and 6 show, the cesium oxide material provides better performance (current density, luminance, and efficiency) as the electron injecting layer than the barium material. For example, at 5.8 volts, there is 100% more current in the OLED with cesium oxide as the electron injecting layer than with barium. Also, the luminance increases by about 120% when cesium oxide is used as the electron injecting layer rather than barium.

Example 3

An OLED was fabricated in the following manner:
(1) for the conducting polymer layer, a 70 nm layer of a hole conducting polymer PEDOT:PSS was deposited on an anode layer comprised of about 120 nm of ITO.
(2) for the emissive polymer layer, a 70 nm layer of Super Yellow was deposited on the 70 nm layer of PEDOT:PSS.
(3) for the electron injecting layer, the cesium oxide layer was deposited on the Super Yellow layer. The cesium oxide layer was formed by the resistive heating of the cesium carbonate, $Cs_2CO_3$, in the vacuum evaporator resulting in the thermal decomposition of the cesium carbonate. The thermal decomposition of the cesium carbonate produced two compounds: the cesium oxide and the carbon dioxide. The produced cesium oxide was deposited on the emissive layer and the carbon dioxide was removed by the vacuum.
(4) for the conductive cathode layer, a 250 nm layer of aluminum was deposited on the cesium oxide layer.

One set of OLED displays were prepared in which the cesium oxide layer had a thickness of 0.3 nm, a second set of displays were prepared in which the cesium oxide layer had a thickness of 0.5 nm, and a third set of displays were prepared in which the cesium oxide layer had a thickness of 1.0 nm. For comparison purposes, a fourth set of displays were prepared as described earlier in Example 1 in which the charge injecting layer is barium with a thickness of 3 nm. Each set had at least four OLED displays with each display having sixteen pixels (i.e., OLEDs).

Figure 7:
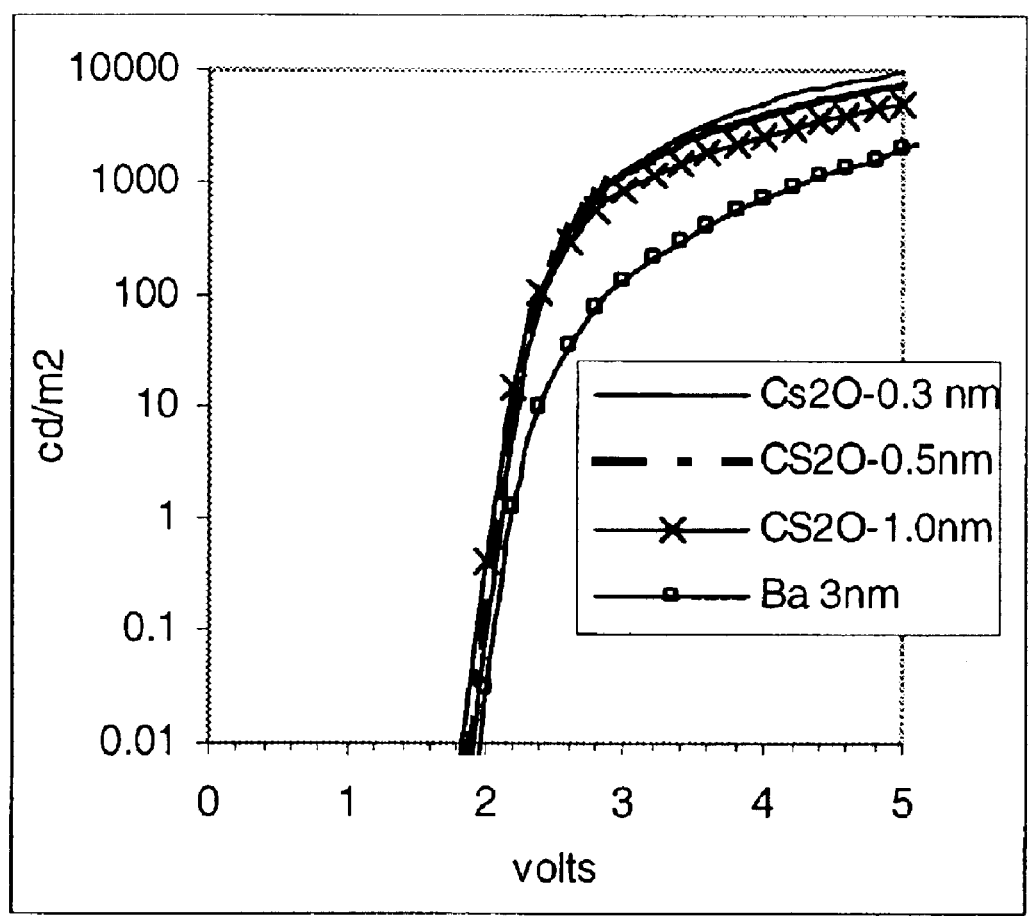
FIG. 7 shows the average luminance versus voltage graph for four different sets of displays.

FIG. 7 shows the average luminance versus voltage graph for the four different sets of displays. FIG. 8 is a table that compares the average luminance and the average half-life of the three different sets of displays with different cesium oxide layer thicknesses. As shown in FIGS. 7 and 8, the performance (luminance and half-life) of the OLEDs is inversely proportional to the thickness of the cesium oxide layer. This is due, in part, to the insulating nature of cesium oxide which becomes a more effective insulator at larger thicknesses thus limiting the electron injection and lowering the luminance. In one example, the figures show that for the cesium oxide layer with a thickness of 0.3 nm, at 5 volts, the average luminance is 9700 cd/m2. The half-life of the 0.3 nm cesium oxide layer at 80° C. and 250 cd/m2 is 110 hours corresponding to 5000 hours at room temperature. As shown by FIG. 7, the turn-on voltage of the OLEDs with the cesium oxide layer is lower than the turn-on voltage of the OLEDs with the barium layer. In addition, the shape of the curves show that the OLEDs using cesium oxide have the desirable characteristic of rapidly reaching the peak luminance given a small increase in voltage and this rapid increase occurs at a low voltage. For example, between the low voltages of 2 to 3 volts, the luminance increases from approximately 0.02 cd/m2 at 2 volts for the OLEDs using cesium oxide to approximately 1000 cd/m2 at 3 volts. These results indicate, for example, that (1) in terms of performance, the cesium oxide is an effective electron injecting layer, and (2) the decomposition product of the cesium carbonate is the low work function cesium oxide.

While the embodiments of the electrode that includes the metal oxide layer (i.e., the alkali metal oxide or the alkaline earth metal oxide) are illustrated in which it is primarily incorporated within an OLED, almost any type of electronic device that uses an electrode may include these embodiments. In particular, embodiments of the electrode of the present invention may also be included in a solar cell, a phototransistor, a laser, a photodetector, or an opto-coupler. The OLED described earlier can be used within displays in applications such as, for example, computer displays, information displays in vehicles, television monitors, telephones, printers, and illuminated signs.

As any person of ordinary skill in the art of light-emitting device fabrication will recognize from the description, figures, and examples that modifications and changes can be made to the embodiments of the invention without departing from the scope of the invention defined by the following claims.

What is claimed:

1. A method to fabricate an electrode, comprising:
   forming a metal oxide layer wherein said metal oxide layer is an alkali metal oxide or an alkaline earth metal oxide that is formed by: (1) decomposing a compound that includes (a) oxygen and (b) an alkali metal or an alkaline earth metal, or (2) thermally reacting at least two compounds where one of said at least two compounds includes said alkali metal or said alkaline earth metal, and another one of said at least two compounds includes said oxygen; and
   depositing a conductive layer on said metal oxide layer.

2. The method of claim 1 wherein
   said compound that includes (a) said oxygen and (b) said alkali metal or said alkaline earth metal is a salt that includes (a) said oxygen and (b) said alkali metal or said alkaline earth metal; and
   said one of said at least two compounds that includes said alkali metal or said alkaline earth metal is a salt that includes said alkali metal or said alkaline earth metal.

3. The method of claim 2 wherein
   said salt that includes (a) said oxygen and (b) said alkali metal or said alkaline earth metal is any one of: formates, acetates, carbonates, bicarbonates, sulphates, nitrates, or oxalates of said alkali metal or said alkaline earth metal; and
   said salt that includes said alkali metal or said alkaline earth metal is any one of: formates, acetates, carbonates, bicarbonates, sulphates, nitrates, or oxalates of said alkali metal or said alkaline earth metal.

4. The method of claim 1 wherein
   said metal oxide layer is a cesium oxide layer;
   said compound that includes (a) said oxygen and (b) said alkali metal or said alkaline earth metal is a compound that includes (a) said oxygen and (b) cesium; and
   said one of said at least two compounds includes said cesium.

5. The method of claim 1 wherein
   said metal oxide layer is a cesium oxide layer;
   said compound that includes (a) said oxygen and (b) said alkali metal or said alkaline earth metal is cesium carbonate;
   said one of said at least two compounds is cesium sulfate; and
   said other one of said at least two compounds is barium oxide.

6. The method of claim 5 wherein said cesium oxide layer is any one of: CsO, $Cs_2O$, or $CsO_2$.

7. The method of claim 5 wherein said cesium oxide layer has a thickness from about 0.2 nm to about 10 nm.

8. The method of claim 1 wherein
   decomposing said compound that includes (a) said oxygen and (b) said alkali metal or said alkaline earth metal includes heating said compound, and
   thermally reacting said at least two compounds includes physically mixing said at least two compounds and then heating said mixture.

9. A method to fabricate an electrode, comprising:
   forming a metal oxide layer wherein said metal oxide layer is an alkali metal oxide or an alkaline earth metal oxide that is formed by thermally reacting at least two compounds where one of said at least two compounds includes (1) oxygen and (2) an alkali metal or an alkaline earth metal; and
   depositing a conductive layer on said metal oxide layer.

10. The method of claim 9 wherein
    said one of said at least two compounds that includes (1) said oxygen and (2) said alkali metal or said alkaline earth metal is a salt that includes (1) said oxygen and (2) said alkali metal or said alkaline earth metal.

11. The method of claim 9 wherein
    said salt that includes (1) said oxygen and (2) said alkali metal or said alkaline earth metal is any one of: formates, acetates, carbonates, bicarbonates, sulphates, nitrates, or oxalates of said alkali metal or said alkaline earth metal.

12. The method of claim 9 wherein
    said metal oxide layer is a cesium oxide layer; and
    said alkali metal or said alkaline earth metal is cesium, wherein said cesium oxide layer is any one of: CsO, $Cs_2O$, or $CsO_2$.

13. The method of claim 9 wherein
    thermally reacting said at least two compounds includes physically mixing said at least two compounds and then heating said mixture.

14. The method of claim 1 wherein decomposing said compound includes heating said compound.

15. The method of claim 1 wherein decomposing said compound produces: (a) said alkali metal oxide or said alkaline earth metal oxide, and (b) residual gasses.

16. The method of claim 15, wherein forming said metal oxide layer further comprises:
    evaporating said alkali metal oxide or said alkaline earth metal oxide; and
    removing said residual gasses.

17. The method of claim 1, wherein thermally reacting said at least two compounds includes
    physically mixing said at least two compounds and then heating said mixture.

18. The method of claim 1 wherein thermally reacting said at least two compounds produces: (a) said alkali metal oxide or said alkaline earth metal oxide, and (b) residual gasses.

19. The method of claim 18 wherein forming said metal oxide layer further comprises:
    evaporating said alkali metal oxide or said alkaline earth metal oxide; and
    removing said residual gasses.

20. The method of claim 9 wherein thermally reacting said at least two compounds produces: (a) said alkali metal oxide or said alkaline earth metal oxide, and (b) residual gasses.

21. The method of claim 20 wherein forming said metal oxide layer further comprises:
    evaporating said alkali metal oxide or said alkaline earth metal oxide; and
    removing said residual gasses.

* * * * *